United States Patent

Suzuki et al.

[11] Patent Number: 5,844,307
[45] Date of Patent: Dec. 1, 1998

[54] PLASTIC MOLDED IC PACKAGE WITH LEADS HAVING SMALL FLATNESS FLUCTUATION

[75] Inventors: Katsunobu Suzuki; Akira Haga, both of Tokyo, Japan

[73] Assignee: NEC Corporation, Tokyo, Japan

[21] Appl. No.: 688,754

[22] Filed: Jul. 31, 1996

[30] Foreign Application Priority Data

Jul. 31, 1995 [JP] Japan .................................... 7-214035

[51] Int. Cl.$^6$ ............................................... H01L 23/48
[52] U.S. Cl. ............................................ 257/690; 257/668
[58] Field of Search ................................... 257/668, 676, 257/690, 691, 692, 693, 678

[56] References Cited

U.S. PATENT DOCUMENTS

| | | |
|---|---|---|
| 4,417,266 | 11/1983 | Grabbe ..................................... 257/668 |
| 4,445,271 | 5/1984 | Grabbe ..................................... 257/668 |
| 4,621,278 | 11/1986 | Miura ....................................... 257/668 |
| 4,801,999 | 1/1989 | Hayward et al. ........................ 257/668 |
| 4,809,135 | 2/1989 | Yerman ................................... 257/668 |
| 4,949,158 | 8/1990 | Ueda ....................................... 257/668 |
| 5,214,845 | 6/1993 | King et al. .............................. 257/668 |
| 5,296,736 | 3/1994 | Frei et al. ............................... 257/668 |
| 5,552,631 | 9/1996 | McCormick ........................... 257/668 |

FOREIGN PATENT DOCUMENTS 2-95256  7/1990  Japan .

Primary Examiner—Olik Chaudhuri
Assistant Examiner—Nathan K. Kelley
Attorney, Agent, or Firm—Young & Thompson

[57] ABSTRACT

In a plastic molded IC package, a metal pattern and leads are formed on a first surface of an insulating layer, and a conductive pattern connected to a semiconductor chip is formed on a second surface of the insulating layer. The conductive pattern is connected to the leads via through holes in the insulating layer.

18 Claims, 17 Drawing Sheets

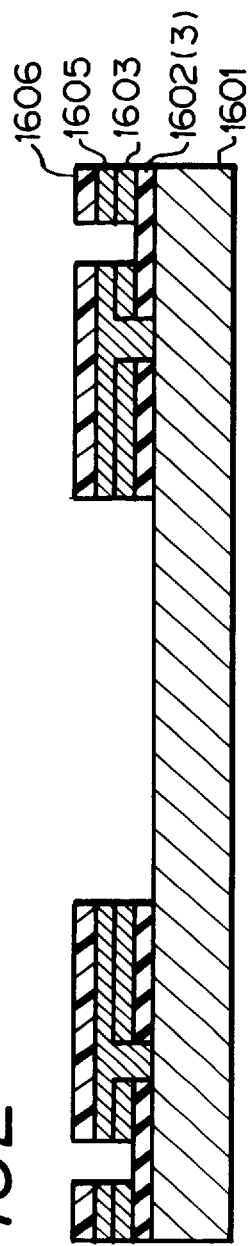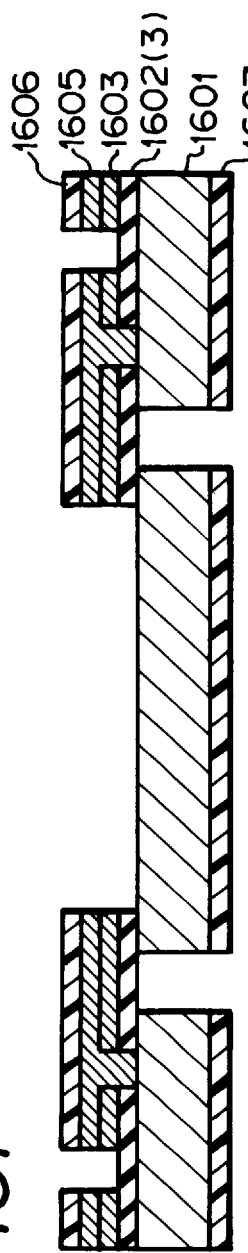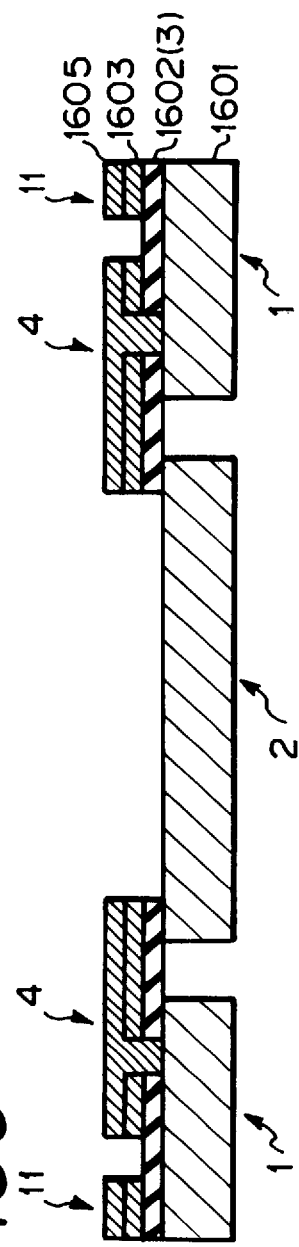

PLASTIC MOLDED IC PACKAGE WITH LEADS HAVING SMALL FLATNESS FLUCTUATION

BACKGROUND OF THE INVENTION

1. Field of the Invention

The present invention relates to a plastic molded integrated circuit (IC) package.

2. Description of the Related Art

In a first prior art plastic molded IC package, a semiconductor chip is mounted on an island, and is coupled by bonding wire to leads. The semiconductor chip, the island, the bonding wire and the leads are sealed by a molding resin. The outerlead portions of the leads protrude from the molding resin, and are bent stepwise. This will be explained later in detail.

In the first prior art plastic molded IC package, however, when the number of pins of the semiconductor chip is increased, the pitch of the leads, i.e., the pitch of the outerleads is reduced, which fluctuates the flatness of the leads. Thus, it is difficult to securely handle the outerleads. Also, the heat-dissipating effect is not sufficient. Further, the outerleads protruded from the molding resin are subject to mechanical impact, and are easily deformed. In addition, the leads are easily deformed by their elastic properties and the thermal expansion and shrinkage of the molding resin.

In a second prior art plastic molded IC package (see Japanese Utility Model Publication No. 2-95256), insulated tapes are adhered to the outerleads, thus securing the flatness of the outerleads. This also will be explained later in detail.

In the second prior art plastic molded IC package, however, the insulated tapes increase the manufacturing cost. Also, the leads are still easily deformed.

In a third prior art plastic molded IC package, a conductive pattern is formed on an intermediate insulating substrate. In this case, the conductive pattern has a plurality of conductive stripes whose pitch is larger on the outer side than on the inner side. A semiconductor chip is connected by bonding wire to the inner side of the conductive pattern, and leads are connected by bonding wire to the outer side of the conductive pattern. Thus, the number of pins of the semiconductor chip can be increased. This also will be explained later in detail.

In the third prior art plastic molded IC package, however, the two wire bonding operations reduce the manufacturing yield, thus increasing the manufacturing cost. Also, the propagation of signals is delayed within the package, thus reducing the speed of the operation. Also, the leads are still easily deformed.

In a fourth prior art plastic molded IC package, a heat spreader made of metal having good heat dissipation characteristics is provided. This also will be explained later in detail.

In the fourth prior art plastic molded IC package, however, the heat spreader and a lead frame increase the manufacturing cost. Also, the leads are still easily deformed.

SUMMARY OF THE INVENTION

It is an object of the present invention to provide a plastic molded IC package with leads having small flatness fluctuation characteristics.

According to the present invention, in a plastic molded IC package, a metal pattern and leads are formed on a first surface of an insulating layer, and a conductive pattern connected to a semiconductor chip is formed on a second surface of the insulating layer. The conductive pattern is connected to the leads via through holes in the insulating layer. Thus, the flatness of the leads are not fluctuated, and also, the leads are hardly deformed.

BRIEF DESCRIPTION OF THE DRAWINGS

The present invention will be more clearly understood from the description as set forth below, as conpared with the prior art, with reference to the accompanying drawings, wherein:

FIGS. 16A through 16G are cross-sectional views for explaining a method for manufacturing the package of FIGS. 13A, 13B and 13C.

DESCRIPTION OF THE PREFERRED EMBODIMENTS

Before the description of the preferred embodiments, prior art plastic molded IC packages will be explained with reference to FIGS. 1A, 1B, 2A, 2B, 3A, 3B, 4A and 4B.

Figure 1A:
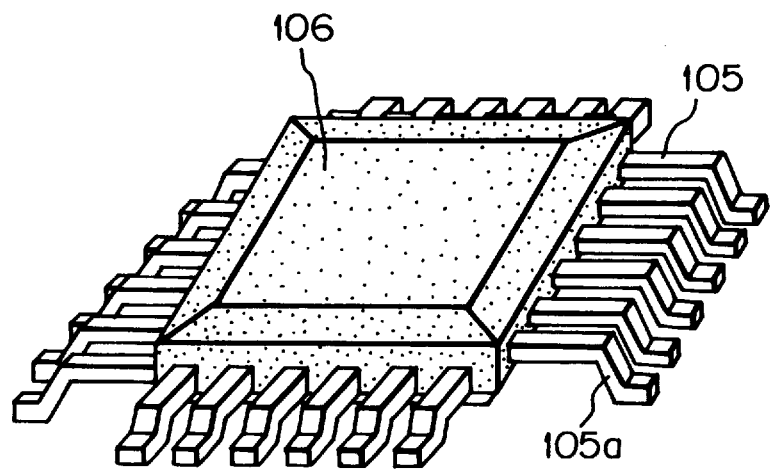
FIG. 1A is a perspective view illustrating a first prior art plastic molded IC package.
Figure 1B:
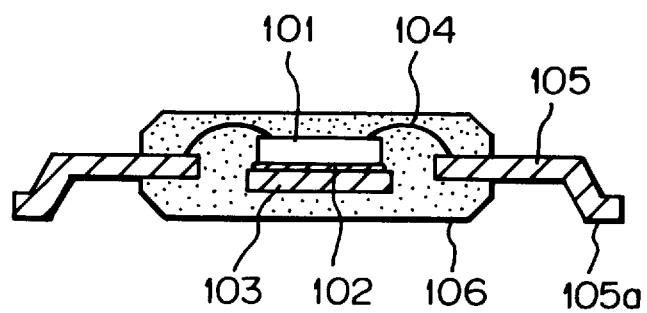
FIG. 1B is a cross-sectional view of the package of FIG. 1A.

In FIGS. 1A and 1B, which are a perspective view and a cross-sectional view, respectively, illustrating a first prior art plastic molded IC package, a semiconductor chip 101 is mounted by an Ag paste adhesive layer 102 on an island 103. Also, the semiconductor chip 101 is coupled by bonding wire 104 to leads 105. The semiconductor chip 101, the Ag paste adhesive layer 102, the island 103, the bonding wire 104 and the leads 105 are sealed by a molding resin envelope 106. Outerleads 105a of the leads 105 protrude from the molding resin envelope 106, and are bent stepwise by a metal mold (not shown).

In the plastic molded IC package of FIGS. 1A and 1B, however, when the number of pins of the semiconductor chip 101 is increased, the pitch of the leads 105, i.e., the pitch of the outerleads 105a is reduced, which fluctuates the flatness of the leads 105a. Thus, it is difficult to securely handle the outerleads 105a, particularly in a quad flat package (QFP) and a tape carrier package (TCP) where the pitch of the outerleads is less than 0.5 mm. Also, QFPs, which have become more fined, require a greater heat-dissipating effect. Further, the outerleads 105a protruded from the molding resin envelope 106 are subject to mechanical impact, and are easily deformed. In addition, the leads 105 are easily deformed by their elastic properties and the thermal expansion and shrinkage of the molding resin envelope 106.

Figure 2A:
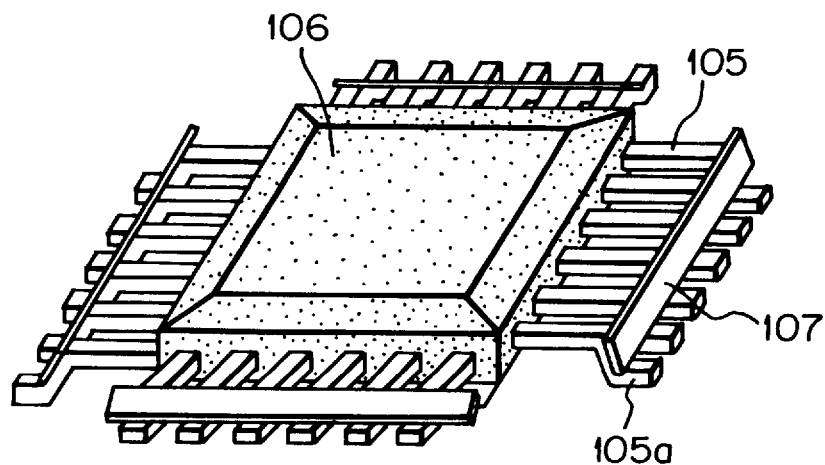
FIG. 2A is a perspective view illustrating a second prior art plastic molded IC package.
Figure 2B:
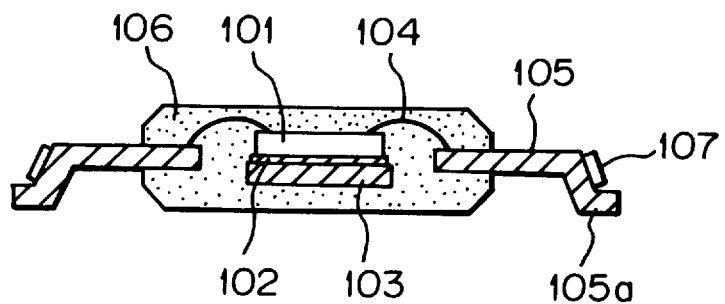
FIG. 2B is a cross-sectional view of the package of FIG. 2A.

In FIGS. 2A and 2B, which are a prespective view and a cross-sectional view, respectively, illustrating a second prior art plastic molded IC package (see Japanese Utility Model Publication No. 2-95256), insulated tapes 107 are adhered to the outerleads 105a of FIGS. 1A and 1B, thus securing the flatness of the outerleads 105a.

In the plastic molded IC package of FIGS. 2A and 2B, however, the insulated tapes 107 increase the manufacturing cost. Also, the leads 105 are still easily deformed.

Figure 3A:
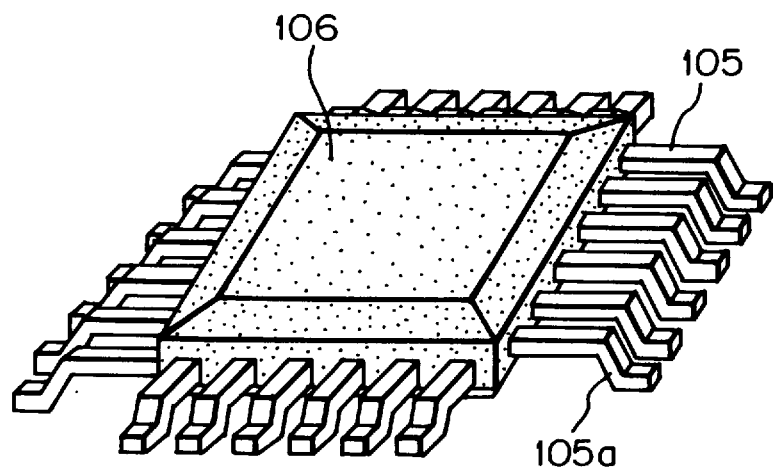
FIG. 3A is a perspective view illustrating a third prior art plastic molded IC package.
Figure 3B:
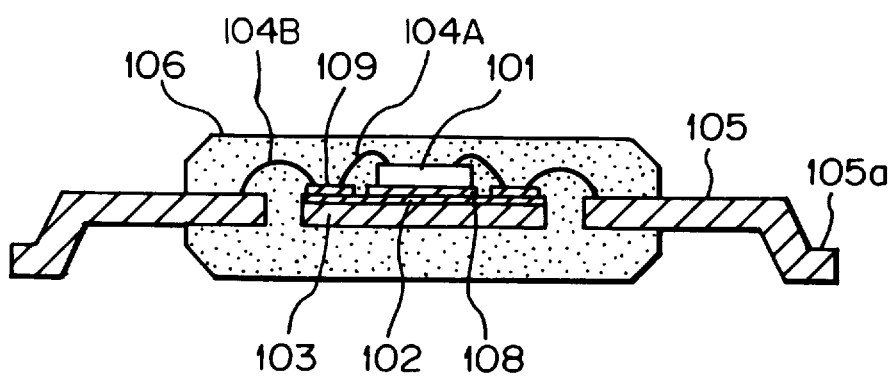
FIG. 3B is a cross-sectional view of the package of FIG. 3A.

In FIGS. 3A and 3B, which are a prespective view and a cross-sectional view, respectively, illustrating a third prior art plastic molded IC package an intermediate insulating substrate 108 is formed on the island 103 of FIGS. 1A and 1B, and a conductive pattern 109 is formed on the intermediate insulating substrate 108. The conductive pattern 109 has a plurality of conductive stripes whose pitch is larger on the outer side than on the inner side. The semiconductor chip 101 is connected by bonding wire 104A to the inner side of the conductive pattern 109, and the leads 105 are connected by bonding wire 104B to the outer side of the conductive pattern 109. Thus, the number of pins of the semiconductor chip 101 can be increased.

In the plastic molded IC package of FIGS. 3A and 3B, however, the two wire bonding operations reduce the manufacturing yield, thus increasing the manufacturing cost. Also, the propagation of signals is delayed within the package, thus reducing the speed of the operation. Also, the leads 105 are still easily deformed.

Figure 4A:
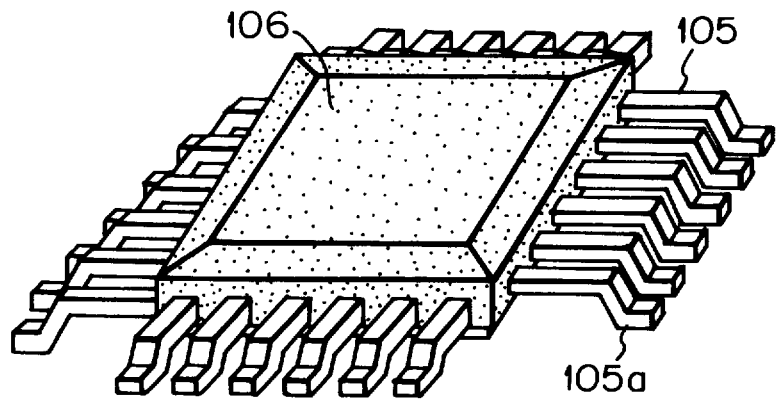
FIG. 4A is a perspective view illustrating a fourth prior art plastic molded IC package.
Figure 4B:
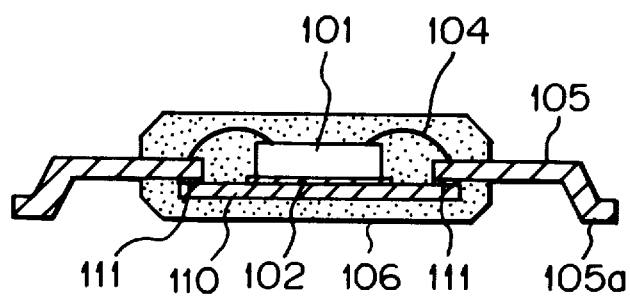
FIG. 4B is a cross-sectional view of the package of FIG. 4A.

In FIGS. 4A and 4B, which are a prespective view and a cross-sectional view, respectively, illustrating a fourth prior art plastic molded IC package, a heat spreader 110 made of metal having good heat dissipation characteristics is provided instead of the island 103 of FIGS. 1A and 1B. That is, the heat spreader 110 is adhered by the Ag paste adhesive layer 102 to the semiconductor chip 101, and simultaneously, the heat spreader 110 is adhered by an insulating resin layer 111 to the innerleads of the leads 105, thus reducing the thermal resistance.

In the plastic molded IC package of FIGS. 4A and 4B, however, the heat spreader 110 and a lead frame for the leads 105 increase the manufacturing cost. Also, the leads 105 are still easily deformed.

Figure 5A:
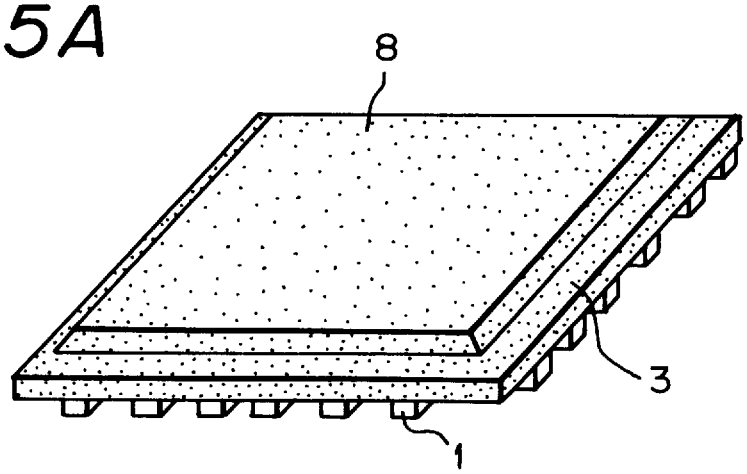
FIG. 5A is a perspective top view illustrating a first embodiment of the plastic molded IC package according to the present invention.
Figure 5B:
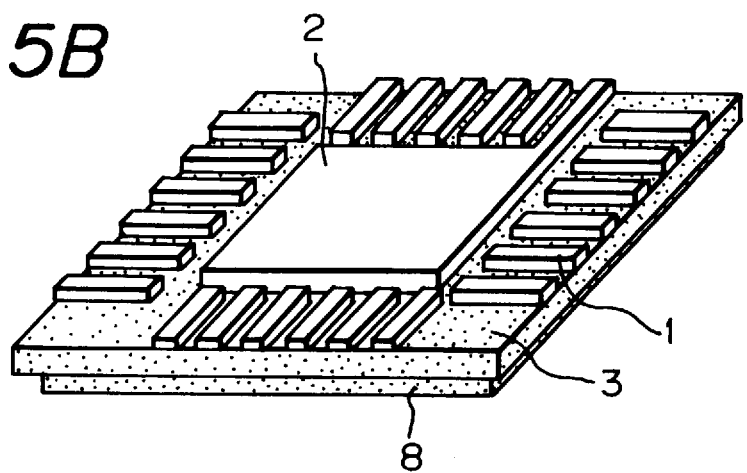
FIG. 5B is a perspective back view of the package of FIG. 5A.
Figure 5C:
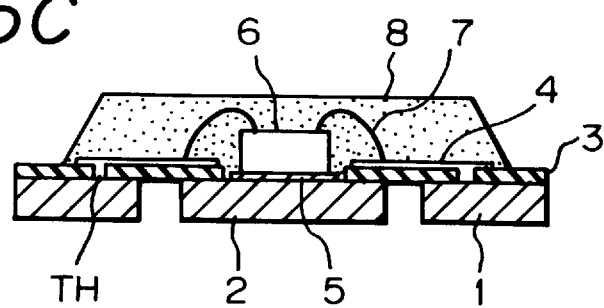
FIG. 5C is a cross-sectional view of the package of FIG. 5A.

In FIGS. 5A, 5B and 5C, which are a perspective top view, a perspective back view and a cross-sectional view, respectively, illustrating a first embodiment of the present invention, leads 1 and a ground pattern 2 are made of an about 0.15 to 0.20 mm thick copper base, and an about 20 to 50 μm thick polyimide layer 3 is provided thereon. Also, a conductive pattern 4 made of an about 18 to 35 μm thich copper foil or the like is provided on the polyimide layer 3. Note that the conductive pattern 4 has a plurality of stripes whose pitch is larger on the outer side than on the inner side. The conductive pattern 4 is connected via through holes TH to the leads 1.

The polyimide layer 3 is perforated at its center portion to form a device hole. An island 5 made of copper is provided through this device hole on the ground pattern 2, and a semiconductor chip 6 is adhered by an Ag paste adhesive layer (not shown) or the like to the island 5.

The semiconductor chip 6 is connected by bonding wire 7 to the conductive pattern 4.

The polyimide layer 3, the conductive pattern 4, the island 5, the semiconductor chip 6, and the bonding wire 7 are sealed by a molding resin envelope 8.

In the plastic molded IC package of FIGS. 5A and 5B, since the leads 1 are entirely mounted on the polyimide layer 3, the flatness of the leads 1 is hardly fluctuated and the leads 1 are hardly deformed. Also, since the number of wire bonding operations is small, the manufacturing cost can be reduced, and the delay of propagation of signals can be suppressed. Further, the ground pattern 2 enhances the heat dissipation of the semiconductor chip 6.

The plastic molded IC package of FIGS. 5A, 5B and 5C is mounted by soldering to a printed circuit board (not shown). In this case, when the pitch of the leads 1 is too narrow, solder bridges (or short-circuits) may be generated between the leads 1.

Figure 6A:
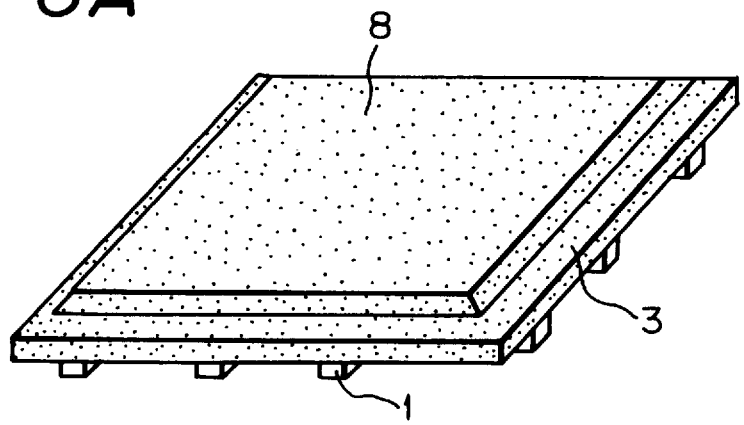
FIG. 6A is a perspective top view illustrating a second embodiment of the plastic molded IC package according to the present invention.
Figure 6B:
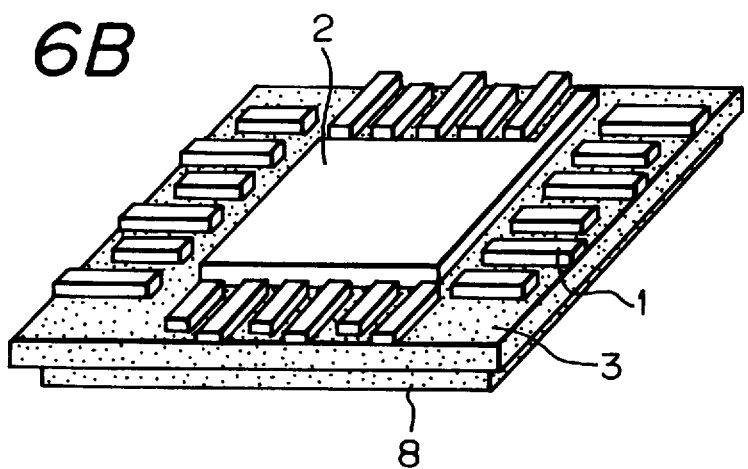
FIG. 6B is a perspective back view of the package of FIG. 6A.
Figure 6C:
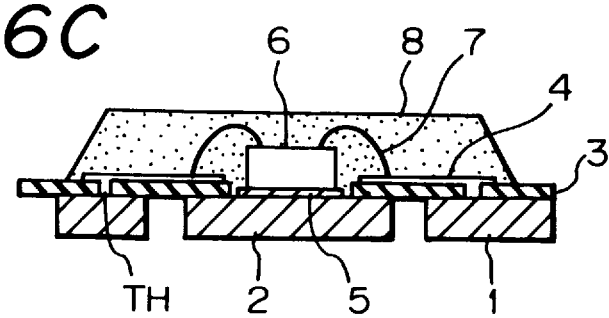
FIG. 6C is a cross-sectional view of the package of FIG. 6A.

In FIGS. 6A, 6B and 6C, which illustrate a second embodiment of the present invention, the outer leads of the leads 1 of FIGS. 5A, 5B and 5C are staggered, thus substantially increasing the pitch of the leads 1. Therefore, the above-described solder bridges can be suppressed.

Figure 7A:
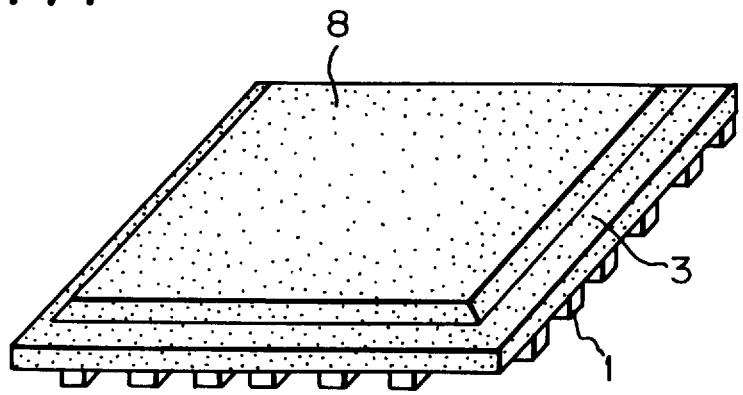
FIG. 7A is a perspective top view illustrating a third embodiment of the plastic molded IC package according to the present invention.
Figure 7B:
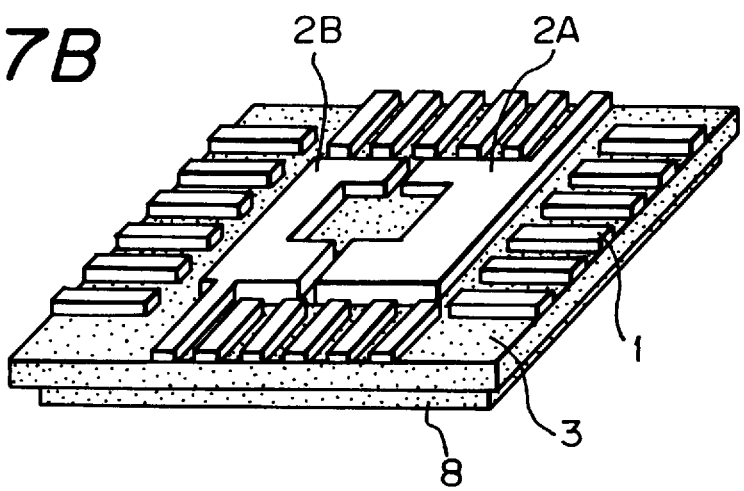
FIG. 7B is a perspective back view of the package of FIG. 7A.
Figure 7C:
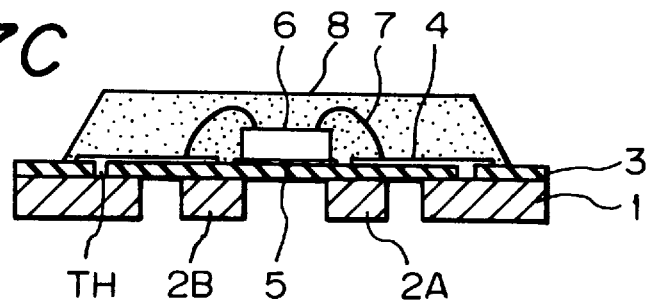
FIG. 7C is a cross-sectional view of the package of FIG. 7A.

In FIGS. 7A, 7B and 7C, which illustrate a third embodiment of the present invention, the device hole of the polyimide layer 3 of FIGS. 5A, 5B and 5C is not present, and patterns 2A and 2B are provided instead of the ground pattern 2 of FIGS. 5A, 5B and 5C. In this case, the patterns 2A and 2B are used for a power supply voltage and a ground voltage, or the patterns 2A and 2B are both used for the ground voltage.

Figure 8A:
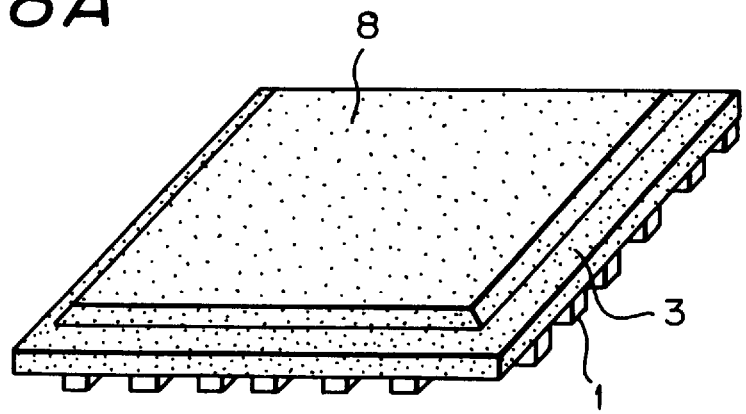
FIG. 8A is a perspective top view illustrating a fourth embodiment of the plastic molded IC package according to the present invention.
Figure 8B:
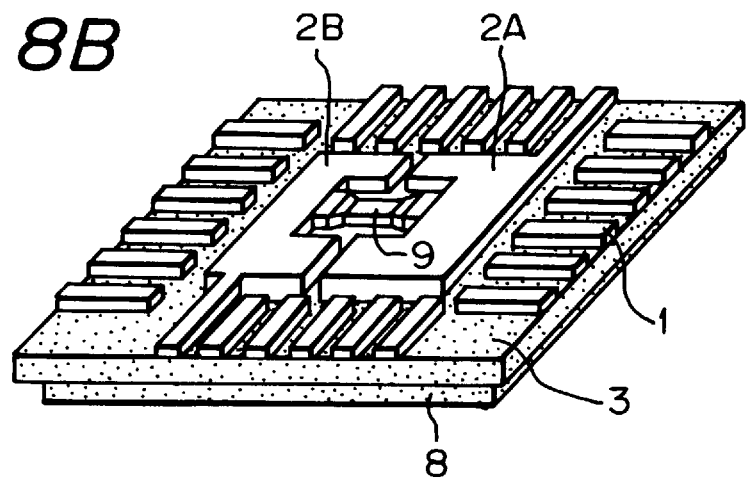
FIG. 8B is a perspective back view of the package of FIG. 8A.
Figure 8C:
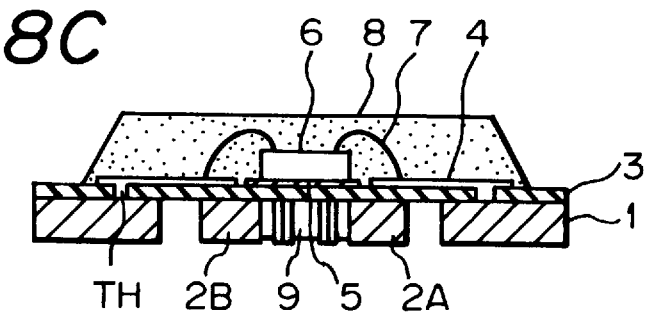
FIG. 8C is a cross-sectional view of the package of FIG. 8A.

In FIGS. 8A, 8B and 8C, which illustrate a fourth embodiment of the present invention, the patterns 2A and 2B of FIGS. 7A, 7B and 7C are used for the power supply voltage and the ground voltage, respectively, and a chip capacitor 9 is inserted between the patterns 2A and 2B. Note that a chip resistor of 50 Ω or 75 Ω can be inserted between the patterns 2A and 2B instead of the chip capacitor 9.

Figure 9A:
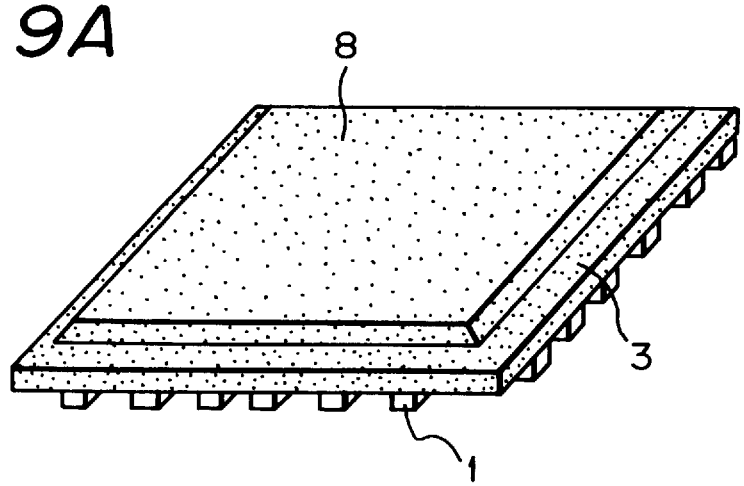
FIG. 9A is a perspective top view illustrating a fifth embodiment of the plastic molded IC package according to the present invention.
Figure 9B:
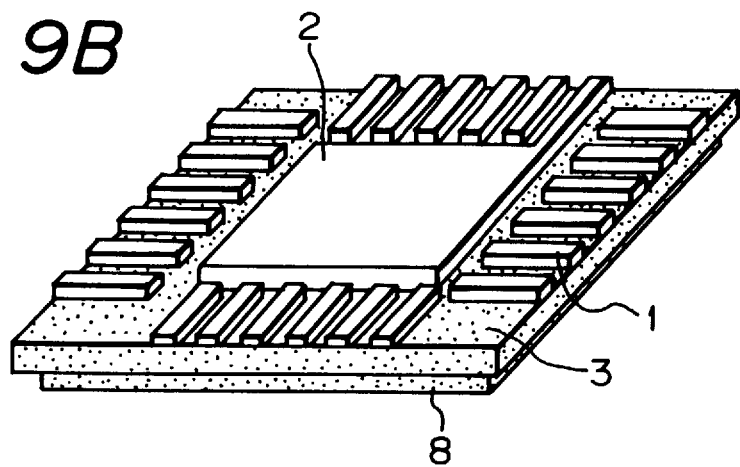
FIG. 9B is a perspective back view of the package of FIG. 9A.
Figure 9C:
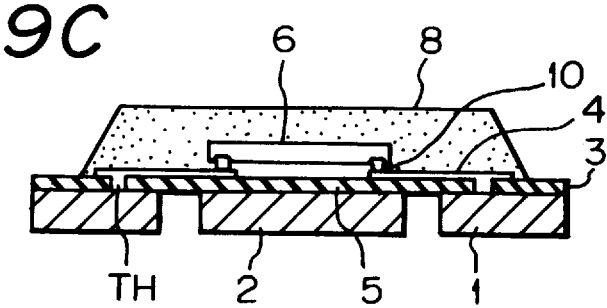
FIG. 9C is a cross-sectional view of the package of FIG. 9A.

In FIGS. 9A, 9B and 9C, which illustrate a fifth embodiment of the present invention, the device hole of the polyimide layer 3 of FIGS. 5A and 5B and 5C is not present, and the semiconductor chip 6 is mounted via micro bumps 10 to the conductive pattern 4. Thus, in this case, the semiconductor chip 6 is of a flip-chip connection type. Note that the micro bumps 10 can be formed on edges of the conductive pattern 4 or on electrodes of the semiconductor chip 6.

Figure 10A:
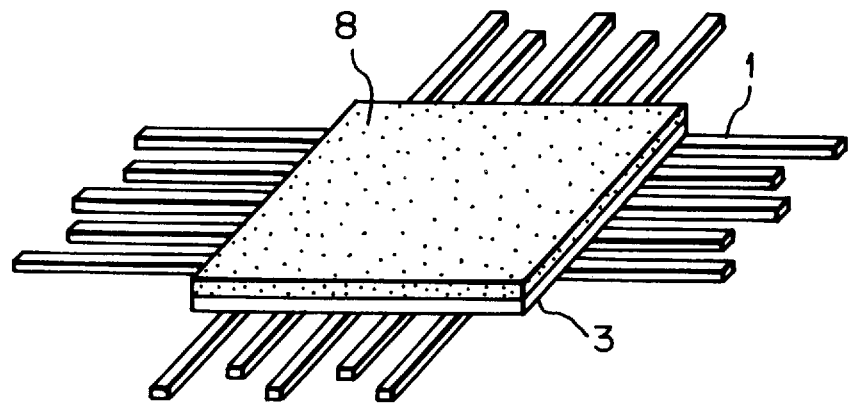
FIG. 10A is a perspective top view illustrating a sixth embodiment of the plastic molded IC package according to the present invention.
Figure 10B:
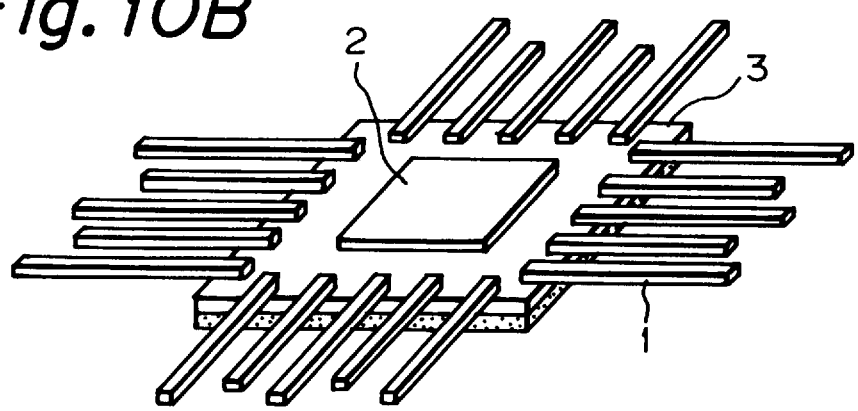
FIG. 10B is a perspective back view of the package of FIG. 10A.
Figure 10C:
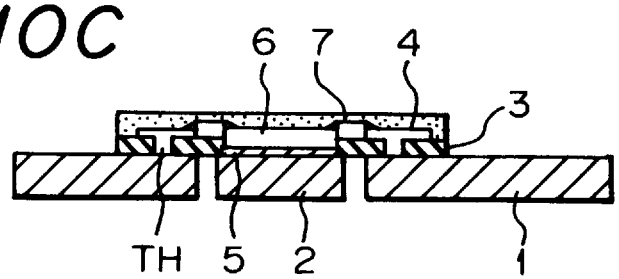
FIG. 10C is a cross-sectional view of the package of FIG. 10A.
Figure 11A:
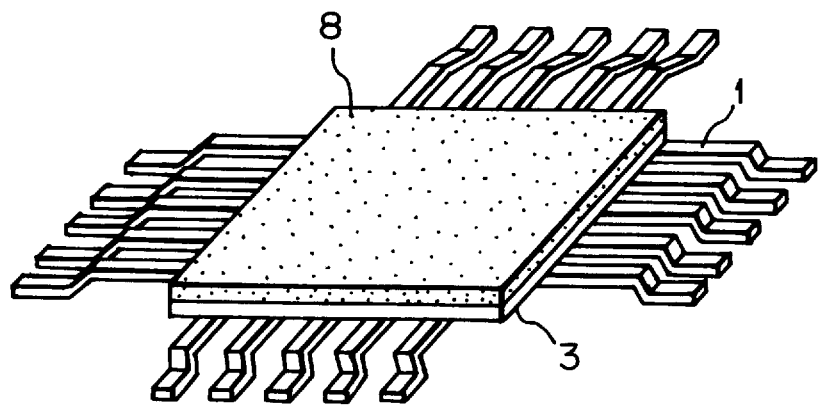
FIGS. 11A, 11B and 11C are respectively a perspective top view, a perspective back view and a cross-sectional view illustrating a modification of the plastic molded IC package of FIGS. 10A, 10B and 10C.
Figure 11B:
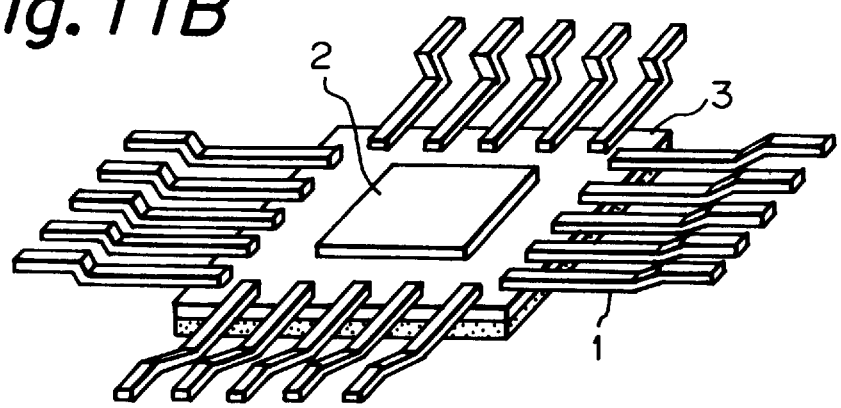
Figure 11C:
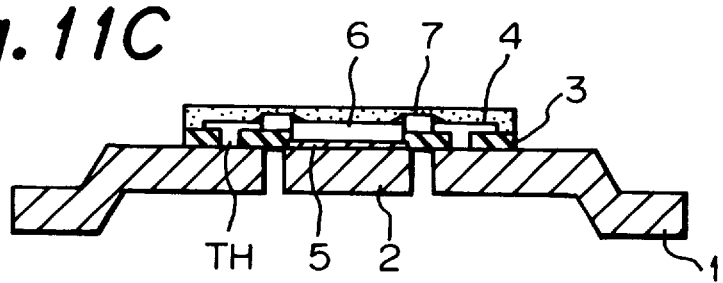
Figure 12A:
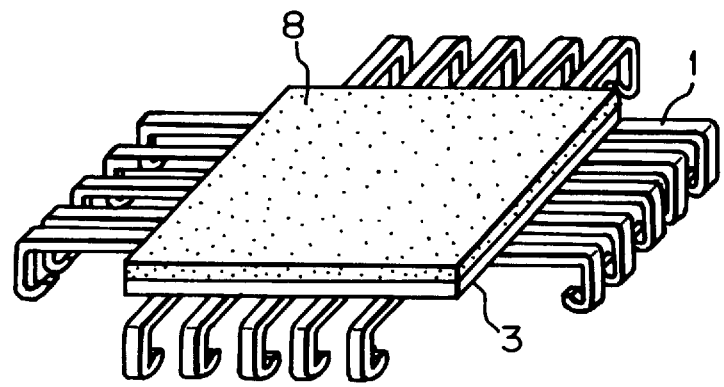
FIGS. 12A, 12B and 12C are respectively a perspective top view, a perspective back view and a cross-sectional view illustrating another modification of the plastic molded IC package of FIGS. 10A, 10B and 10C.
Figure 12B:
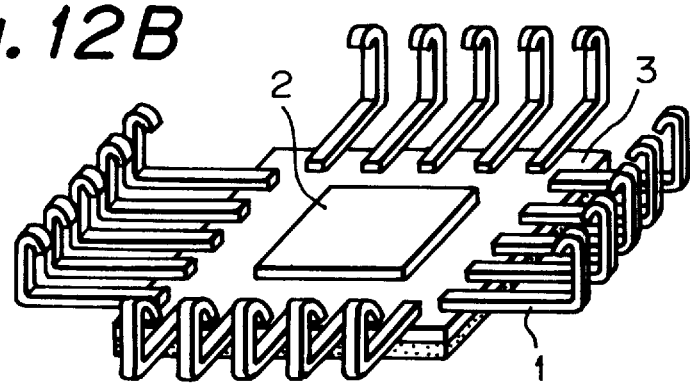
Figure 12C:
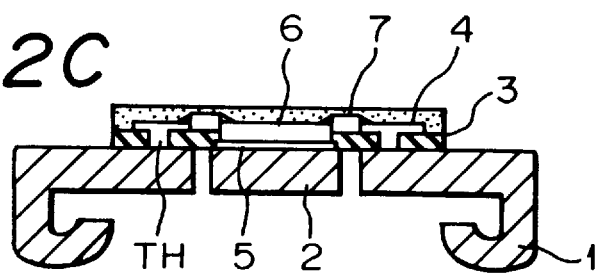

In FIGS. 10A, 10B and 10C, which illustrates a sixth embodiment of the present invention, the leads 1 of FIGS. 5A, 5B and 5C are extruded from the polyimide layer 3. Also, the outer leads 1a of the leads 1 are staggered, thus substantially increasing the pitch of the leads 1. Therefore, the solder bridges can be suppressed. Further, the leads 1 can be deformed in a gull wing shape as illustrated in FIGS. 11A, 11B and 11C. Further, the leads 1 can be deformed in a J shape as illustrated in FIGS. 12A, 12B and 12C.

Figure 13A:
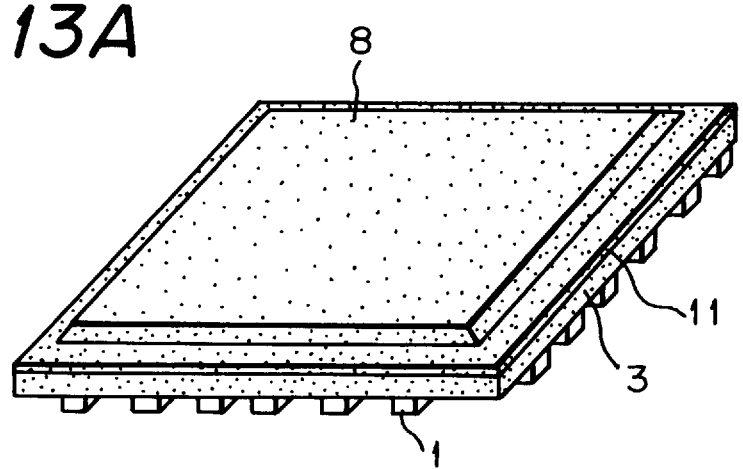
FIG. 13A is a perspective top view illustrating a seventh embodiment of the plastic molded IC package according to the present invention.
Figure 13B:
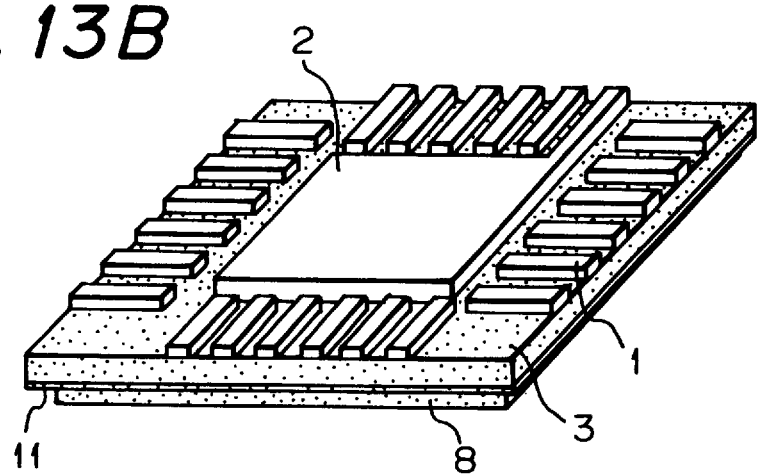
FIG. 13B is a perspective back view of the package of FIG. 13A.
Figure 13C:
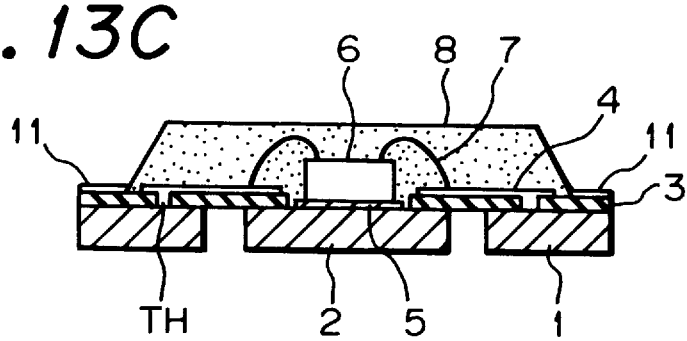
FIG. 13C is a cross-sectional view of the package of FIG. 13A.

In FIGS. 13A, 13B and 13C, which illustrate a seventh embodiment of the present invention, a ring pattern 11 is provided on an outer periphery of the conductive pattern 4 and is separated therefrom. The power supply voltage or the ground voltage can be applied to the ring pattern 11. When the molding resin envelope 8 is formed, the ring pattern 11 dams up the resin.

Figure 14:
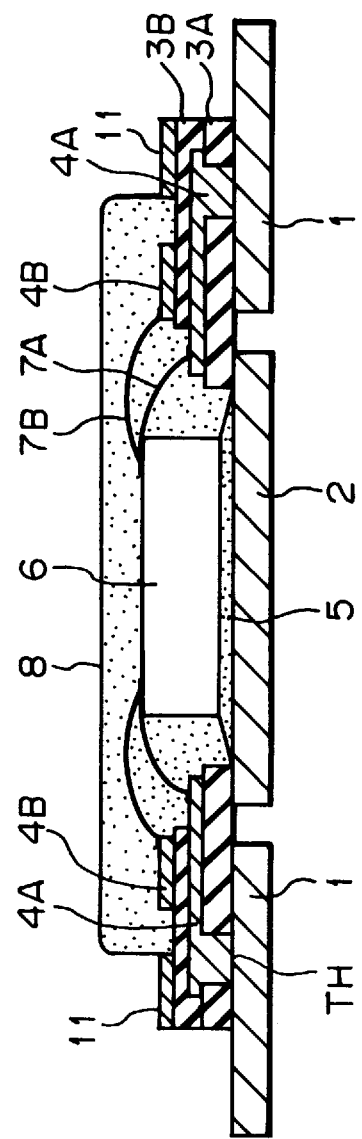
FIG. 14 is a cross-sectional view illustrating an eighth embodiment of the plastic molded IC package according to the present invention.

In FIG. 14, which illustrates an eighth embodiment of the present invention, two polyimide layers 3A and 3B are provided instead of the polyimide layer 3 of FIG. 13C. Also, conductive patterns 4A and 4B are formed on the polyimide layers 3A and 3B, respectively, and are connected by bonding wire 7A and 7B to the semiconductor chip 6. Note that the ring pattern 11 is formed on the polyimide layer 3B.

Figure 15:
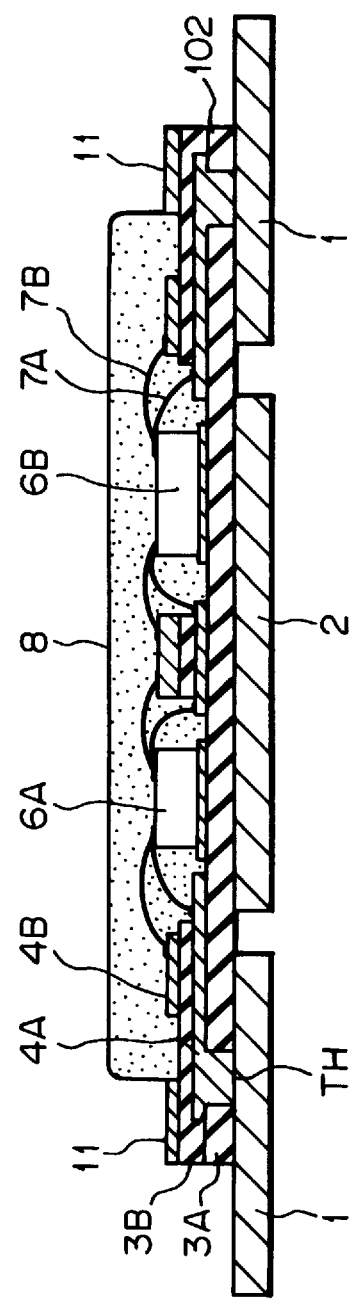
FIG. 15 is a cross-sectional view illustrating a ninth embodiment of the plastic molded IC package according to the present invention.

In FIG. 15, which illustrates a ninth embodiment of the present invention, two semiconductor chips 6A and 6B are provided instead of the semiconductor chip 6 of FIG. 14. Note that the present invention can be applied to a package including three or more semiconductor chips.

The steps of manufacturing the semiconductor devices of the first to ninth embodiments of the present invention are similar to each other. A method for manufacturing the package of FIGS. 13A, 13B and 13C is explained next with reference to FIGS. 16A through 16G.

Figure 16A:
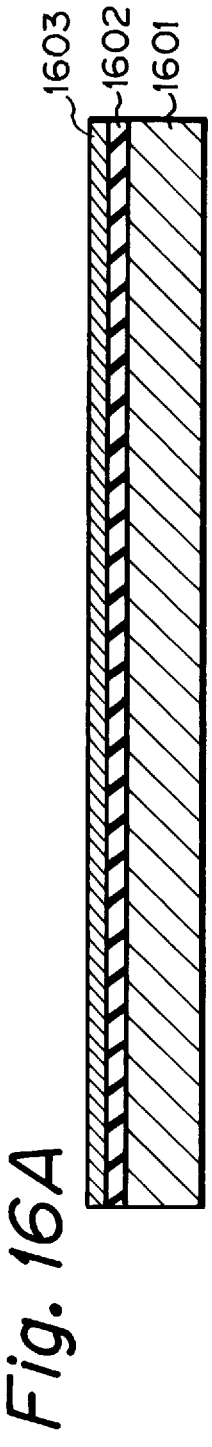

First, referring to FIG. 16A, an about 0.15 to 0.20 mm thick copper base 1601 is provided. Then, an about 20 to 50 $\mu$m thick polyimide layer 1602 is deposited on the copper base 1601, and an about 9 to 18 $\mu$m thick copper foil 1603 is deposited on the polyimide layer 1602

Figure 16B:
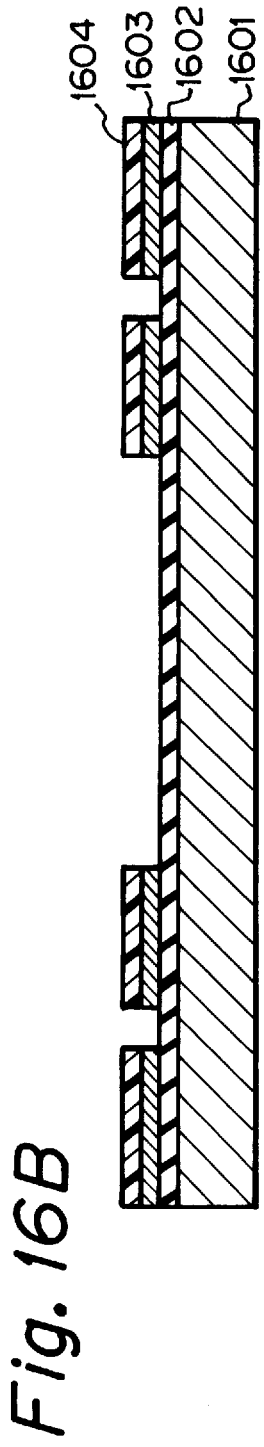

Next, referring to FIG. 16B, a photoresist pattern 1604 is formed by a photolithography process, and the copper foil 1603 is etched by using the photoresist pattern 1604 as a mask. Then, the photoresist pattern 1604 is removed.

Figure 16C:
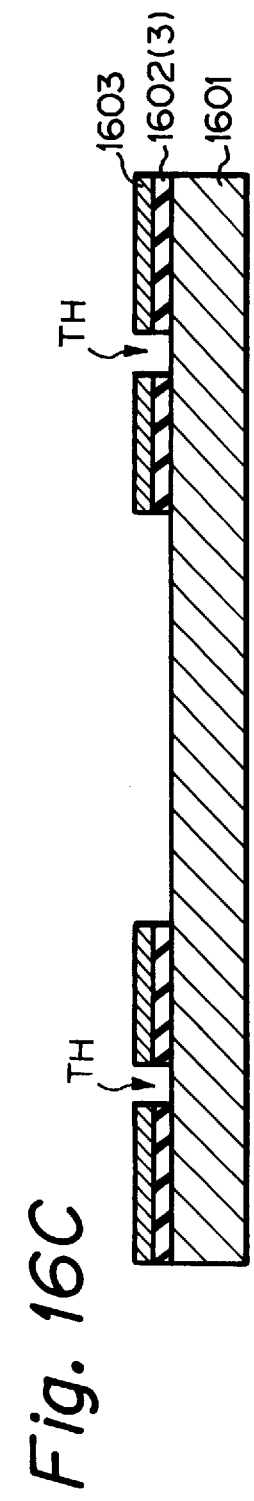

Next, referring to FIG. 16C, the polyimide layer 1602 is etched by using the copper foil 1603 as a mask. Thus, the polyimide layer 3 of FIGS. 13A, 13B and 13C is obtained. Also, the through holes TH of the polyimide layer 3 of FIGS. 13A, 13B and 13C are formed.

Figure 16D:
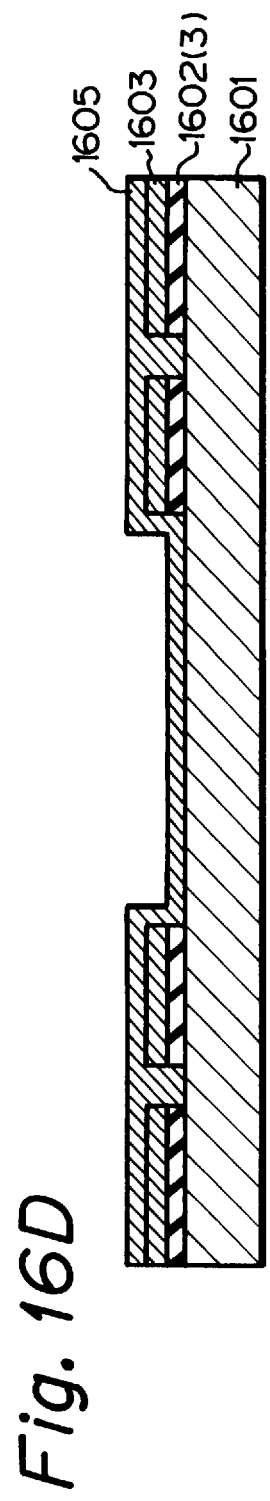

Next, referring to FIG. 16D, an about 9 to 17 $\mu$m copper layer 1605 is deposited by plating on the entire surface.

Next, referring to FIG. 16E, a photoresist pattern 1606 is formed by a photolithography process, and the copper layer 1605 and 1603 are etched by using the photoresist pattern 1606 as a mask.

Next, referring to FIG. 16F, a photoresist pattern 1607 is formed by a photolithography process, and the copper base 1601 is etched by using the photoresist pattern 1607 as a mask.

Next, referring to FIG. 16G, the photoresist patterns 1606 and 1607 are removed. As a result, the leads 1, the ground pattern 2, the conductive pattern 4 and the ring pattern 11 are obtained.

Then, the island 5 and the semiconductor chip 6 are mounted on the device hole of FIG. 16G, and the bonding wire 7 is bonded between the semiconductor chip 6 and the conductive pattern 4. Finally, resin is injected by sandwiching the device with metal molds, thus completing the semiconductor devices of FIGS. 13A, 13B and 13C.

As explained hereinabove, according to the present invention, since leads are formed on an insulating layer and are connected via throughholes of the insulating layer to a conductive pattern which are connected to a semiconductor chip, the flatness of the leads is not fluctuated, and also, the leads are hardly deformed.

We claim:

1. A semiconductor package comprising:
   an insulating layer having first and second surfaces;
   a ground pattern formed on the first surface of said insulating layer;
   leads formed on the first surface of said insulating layer;
   a conductive pattern having a plurality of stripes whose pitch is larger on an outer side than on an inner side and formed on the second surface of said insulating layer and connected via through holes of said insulating layer to said leads;
   a semiconductor chip connected to said conductive pattern; and
   a molding resin envelope sealing said semiconductor chip.

2. The package as set forth in claim 1, wherein outer edges of said leads are staggered.

3. The package as set forth in claim 1, further comprising an island formed on said ground pattern through a device hole of said insulating layer, said semiconductor chip being mounted on said island.

4. The package as set forth in claim 3, wherein said semiconductor chip is connected by bonding wire to said conductive pattern.

5. The package as set forth in claim 1, wherein said semiconductor chip is connected by micro bumps to said conductive layer.

6. The package as set forth in claim 1, wherein said leads are protruded from said insulating layer.

7. The package as set forth in claim 6, wherein outer edges of said leads are in a gull wing shape.

8. The package as set forth in claim 6, wherein outer edges of said leads are in a J shape.

9. The package as set forth in claim 1, further comprising a ring pattern formed in an outer portion of the second surface of said insulating layer.

10. The package as set forth in claim 4, further comprising;

another insulating layer formed on said insulating layer; and another conductive pattern formed on said other insulating layer, said semiconductor chip being connected by another bonding wire to said other conductive layer.

11. The package as set forth in claim 1, further comprising other semiconductor chips connected to said conductive pattern.

12. A semiconductor package comprising:

an insulating layer having first and second surfaces;

isolated first and second metal patterns formed on the first surface of said insulating layer;

leads formed on the first surface of said insulating layer;

a conductive pattern having a plurality of stripes whose pitch is larger on an outer side than on an inner side and formed on the second surface of said insulating layer and connected via through holes of said insulating layer to said leads;

a semiconductor chip formed on the second surface of said insulating layer and connected to said conductive pattern; and a molding resin envelope sealing said semiconductor chip.

13. The package as set forth in claim 12, further comprising an island formed between said semiconductor chip and said insulating layer.

14. The package as set forth in claim 12, wherein said semiconductor chip is connected by bonding wire to said conductive pattern.

15. The package as set forth in claim 12, further comprising a chip capacitor inserted between said metal patterns.

16. The package as set forth in claim 12, further comprising a chip resistor inserted between said metal patterns.

17. The package of claim 1, wherein said ground pattern further comprises a central portion connected to an electrode on a first side of said chip and a ground lead on said first surface that is an extension of said central portion.

18. The package of claim 17, wherein said conductive pattern is connected to electrodes on a second side of said chip.

* * * * *